(12) United States Patent
Lee et al.

(10) Patent No.: US 7,825,594 B2
(45) Date of Patent: Nov. 2, 2010

(54) ORGANIC LIGHT EMITTING DISPLAY AND FABRICATING METHOD OF THE SAME

(75) Inventors: Jae Sun Lee, Yongin-si (KR); Jin Woo Park, Yongin-si (KR); Ho Seok Lee, Yongin-si (KR); Dong Soo Choi, Yongin-si (KR); Dae Ho Lim, Yongin-si (KR); Ung Soo Lee, Yongin-si (KR); Chan Hee Wang, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 616 days.

(21) Appl. No.: 11/540,149

(22) Filed: Sep. 29, 2006

(65) Prior Publication Data
US 2007/0170324 A1    Jul. 26, 2007

(30) Foreign Application Priority Data
Jan. 25, 2006    (KR) .................... 10-2006-0007889

(51) Int. Cl.
*H01J 1/62* (2006.01)
*H01J 63/04* (2006.01)
(52) U.S. Cl. ................ 313/512; 313/483; 313/503; 313/504; 313/505; 313/506; 313/498; 313/500
(58) Field of Classification Search .............. None
See application file for complete search history.

(56) References Cited
U.S. PATENT DOCUMENTS
3,966,449 A    6/1976 Foster
(Continued)

FOREIGN PATENT DOCUMENTS
CN    1290121 A    4/2001
(Continued)

OTHER PUBLICATIONS
English translation of KR 2005-070543 (KIM).*
(Continued)

*Primary Examiner*—Nimeshkumar D Patel
*Assistant Examiner*—Natalie K Walford
(74) *Attorney, Agent, or Firm*—Knobbe Martens Olson & Bear LLP

(57) ABSTRACT

Disclosed are an organic light emitting display and a fabricating method of the same, which form a bracket by at least one material selected from the group consisting of a plastic, a reinforcement plastic, or a high elastic and high molecular organic material in order to enhance an adhesive strength and an elasticity of a substrate and a bracket adhered to each other by means of an adhesive. A first substrate includes a pixel region and a non-pixel region. At least one organic light emitting diode is formed at the pixel region and having a first electrode, an organic layer, and a second electrode. The non-pixel region is formed beside pixel region. A second substrate is bonded to a first side of the first substrate to seal the pixel region. A frit is disposed between the non-pixel region of the first substrate and the second substrate and adheres the first and second substrates to each other. A bracket is formed by at least one material selected from the group consisting of a plastic, a reinforcement plastic, or a high elastic and high molecular organic material. An adhesive is formed by at least one resin selected from the group consisting of epoxy, acrylate, urethane acrylate, and acrylate cyanide, and for adhering the bracket to the first substrate.

15 Claims, 8 Drawing Sheets

U.S. PATENT DOCUMENTS

| | | | |
|---|---|---|---|
| 4,105,292 A | 8/1978 | Conder et al. | |
| 4,238,704 A | 12/1980 | Bonk et al. | |
| 4,702,566 A | 10/1987 | Tukude | |
| 4,826,297 A | 5/1989 | Kubo et al. | |
| 4,984,059 A | 1/1991 | Kubota et al. | |
| 5,808,719 A | 9/1998 | Fujiwara et al. | |
| 5,811,927 A | 9/1998 | Anderson et al. | |
| 5,965,907 A | 10/1999 | Huang et al. | |
| 6,005,653 A | 12/1999 | Matsuzawa | |
| 6,087,717 A | 7/2000 | Ano et al. | |
| 6,195,142 B1 | 2/2001 | Gyotoku et al. | |
| 6,210,815 B1 | 4/2001 | Ooishi | |
| 6,211,938 B1 | 4/2001 | Mori | |
| 6,288,487 B1* | 9/2001 | Arai | 313/506 |
| 6,424,009 B1 | 7/2002 | Ju | |
| 6,452,323 B1 | 9/2002 | Byrum et al. | |
| 6,489,719 B1 | 12/2002 | Young et al. | |
| 6,495,262 B2 | 12/2002 | Igeta | |
| 6,515,417 B1 | 2/2003 | Duggal et al. | |
| 6,551,724 B2 | 4/2003 | Ishii et al. | |
| 6,554,672 B2 | 4/2003 | Dunham et al. | |
| 6,555,025 B1 | 4/2003 | Krupetsky et al. | |
| 6,590,337 B1 | 7/2003 | Nishikawa et al. | |
| 6,603,254 B1 | 8/2003 | Ando | |
| 6,605,826 B2 | 8/2003 | Yamazaki et al. | |
| 6,624,572 B1 | 9/2003 | Kim et al. | |
| 6,646,284 B2 | 11/2003 | Yamazaki et al. | |
| 6,650,392 B2 | 11/2003 | Iwanaga et al. | |
| 6,660,547 B2 | 12/2003 | Guenther | |
| 6,671,029 B1 | 12/2003 | Choi | |
| 6,717,052 B2 | 4/2004 | Wang et al. | |
| 6,744,199 B1 | 6/2004 | Tanaka | |
| 6,791,660 B1 | 9/2004 | Hayashi et al. | |
| 6,831,725 B2 | 12/2004 | Niiya | |
| 6,833,668 B1 | 12/2004 | Yamada et al. | |
| 6,861,801 B2 | 3/2005 | Kim et al. | |
| 6,878,467 B2 | 4/2005 | Chung et al. | |
| 6,896,572 B2 | 5/2005 | Park et al. | |
| 6,914,661 B2 | 7/2005 | Masuda et al. | |
| 6,924,594 B2 | 8/2005 | Ogura et al. | |
| 6,936,963 B2 | 8/2005 | Langer et al. | |
| 6,956,324 B2 | 10/2005 | Yamazaki | |
| 6,956,638 B2 | 10/2005 | Akiyama et al. | |
| 6,965,195 B2* | 11/2005 | Yamazaki et al. | 313/498 |
| 6,980,275 B1 | 12/2005 | Konuma et al. | |
| 6,993,537 B2 | 1/2006 | Buxton et al. | |
| 6,998,776 B2 | 2/2006 | Aitken et al. | |
| 7,030,558 B2 | 4/2006 | Park et al. | |
| 7,098,589 B2 | 8/2006 | Erchak et al. | |
| 7,112,115 B1 | 9/2006 | Yamazaki et al. | |
| 7,141,925 B2 | 11/2006 | Wittmann et al. | |
| 7,154,218 B2 | 12/2006 | Murakami et al. | |
| 7,178,927 B2 | 2/2007 | Seo | |
| 7,186,020 B2 | 3/2007 | Taya et al. | |
| 7,187,121 B2 | 3/2007 | Hasegawa et al. | |
| 7,193,218 B2 | 3/2007 | Nagano | |
| 7,193,364 B2 | 3/2007 | Klausmann et al. | |
| 7,193,366 B2 | 3/2007 | Tomimatsu et al. | |
| 7,202,602 B2 | 4/2007 | Anandan | |
| 7,211,938 B2 | 5/2007 | Tanaka | |
| 7,214,429 B2 | 5/2007 | Kato et al. | |
| 7,247,986 B2 | 7/2007 | Kang et al. | |
| 7,255,823 B1 | 8/2007 | Guether et al. | |
| 7,291,977 B2 | 11/2007 | Kim et al. | |
| 7,306,346 B2 | 12/2007 | Fukuoka et al. | |
| 7,317,281 B2 | 1/2008 | Hayashi et al. | |
| 7,332,858 B2 | 2/2008 | Nomura et al. | |
| 7,342,357 B2 | 3/2008 | Sakano et al. | |
| 7,344,901 B2 | 3/2008 | Hawtof et al. | |
| 7,359,021 B2 | 4/2008 | Ota et al. | |
| 7,371,143 B2 | 5/2008 | Becken et al. | |
| 7,393,257 B2 | 7/2008 | Spencer et al. | |
| 7,407,423 B2 | 8/2008 | Aitken et al. | |
| 7,423,375 B2 | 9/2008 | Guenther et al. | |
| 7,425,166 B2* | 9/2008 | Burt et al. | 445/25 |
| 7,425,518 B2 | 9/2008 | Yoshida et al. | |
| 7,426,010 B2 | 9/2008 | Lee et al. | |
| 7,452,738 B2 | 11/2008 | Hayashi et al. | |
| 7,474,375 B2 | 1/2009 | Kwak et al. | |
| 7,498,186 B2 | 3/2009 | Lee | |
| 7,528,544 B2 | 5/2009 | Kwak et al. | |
| 7,537,504 B2* | 5/2009 | Becken et al. | 445/25 |
| 7,514,280 B2 | 7/2009 | Lee | |
| 7,564,185 B2 | 7/2009 | Song et al. | |
| 7,579,203 B2 | 8/2009 | Yamazaki et al. | |
| 7,579,220 B2 | 8/2009 | Ohnuma et al. | |
| 7,585,022 B2 | 9/2009 | Achilles et al. | |
| 7,586,254 B2 | 9/2009 | Kwak et al. | |
| 7,597,603 B2* | 10/2009 | Becken et al. | 445/24 |
| 2002/0125817 A1 | 9/2002 | Yamazaki et al. | |
| 2003/0066311 A1 | 4/2003 | Li et al. | |
| 2003/0077396 A1 | 4/2003 | Lecompte et al. | |
| 2004/0069017 A1 | 4/2004 | Li et al. | |
| 2004/0075380 A1 | 4/2004 | Takemoto et al. | |
| 2004/0104655 A1* | 6/2004 | Kodera et al. | 313/292 |
| 2004/0169033 A1 | 9/2004 | Kuibira et al. | |
| 2004/0169174 A1 | 9/2004 | Huh et al. | |
| 2004/0206953 A1 | 10/2004 | Morena et al. | |
| 2005/0127820 A1 | 6/2005 | Yamazaki et al. | |
| 2005/0231107 A1 | 10/2005 | Yamazaki et al. | |
| 2005/0248270 A1 | 11/2005 | Ghosh et al. | |
| 2005/0275342 A1 | 12/2005 | Yanagawa | |
| 2006/0082298 A1 | 4/2006 | Becken et al. | |
| 2006/0084348 A1 | 4/2006 | Becken et al. | |
| 2006/0284556 A1 | 12/2006 | Tremel et al. | |
| 2006/0290261 A1* | 12/2006 | Sawai et al. | 313/495 |
| 2007/0120478 A1 | 5/2007 | Lee et al. | |
| 2007/0170423 A1 | 7/2007 | Choi et al. | |
| 2007/0170605 A1 | 7/2007 | Lee et al. | |
| 2007/0170839 A1 | 7/2007 | Choi et al. | |
| 2007/0170845 A1 | 7/2007 | Choi et al. | |
| 2007/0170850 A1 | 7/2007 | Choi et al. | |
| 2007/0170855 A1 | 7/2007 | Choi et al. | |
| 2007/0170857 A1 | 7/2007 | Choi et al. | |
| 2007/0170859 A1 | 7/2007 | Choi et al. | |
| 2007/0170860 A1* | 7/2007 | Choi et al. | 313/512 |
| 2007/0170861 A1 | 7/2007 | Lee et al. | |
| 2007/0171637 A1 | 7/2007 | Choi | |
| 2007/0172971 A1 | 7/2007 | Boroson | |
| 2007/0173167 A1 | 7/2007 | Choi et al. | |
| 2007/0176549 A1 | 8/2007 | Park | |
| 2007/0177069 A1 | 8/2007 | Lee | |
| 2007/0197120 A1 | 8/2007 | Lee | |
| 2007/0232182 A1 | 10/2007 | Park | |
| 2008/0074036 A1* | 3/2008 | Wang et al. | 313/504 |

FOREIGN PATENT DOCUMENTS

| | | |
|---|---|---|
| CN | 1438825 | 8/2003 |
| CN | 1551686 A | 12/2004 |
| CN | 1577413 | 2/2005 |
| CN | 161636 | 5/2005 |
| CN | 1212662 | 7/2005 |
| CN | 1670570 | 9/2005 |
| JP | 030-37933 | 2/1991 |
| JP | 04-147217 | 5/1992 |
| JP | 04-301879 | 10/1992 |
| JP | 06-34983 | 2/1994 |
| JP | 06-337429 | 10/1994 |
| JP | 07-74583 | 3/1995 |
| JP | 09-258671 | 3/1997 |
| JP | 09-278483 | 10/1997 |
| JP | 10-074583 | 3/1998 |
| JP | 10-74583 | 3/1998 |

| | | |
|---|---|---|
| JP | 10-161137 | 6/1998 |
| JP | 63-163423 | 7/1998 |
| JP | 10-201585 | 8/1998 |
| JP | 11-007031 | 1/1999 |
| JP | 11-202349 | 7/1999 |
| JP | 2001-022293 | 1/2001 |
| JP | 2001-052858 | 2/2001 |
| JP | 2001-55527 | 2/2001 |
| JP | 2001-203076 | 2/2001 |
| JP | 2001-110564 | 4/2001 |
| JP | 2001-230072 | 8/2001 |
| JP | 2001-319775 | 11/2001 |
| JP | 2002 020169 | 1/2002 |
| JP | 2002-93576 | 3/2002 |
| JP | 2002-100472 | 4/2002 |
| JP | 2002-117777 | 4/2002 |
| JP | 2002 117777 | 4/2002 |
| JP | 2002 170664 | 6/2002 |
| JP | 2002-190267 | 7/2002 |
| JP | 2002-216951 | 8/2002 |
| JP | 2002-280169 | 9/2002 |
| JP | 2002-318547 | 10/2002 |
| JP | 2001-324662 | 11/2002 |
| JP | 2002-359070 | 12/2002 |
| JP | 2003-123966 | 4/2003 |
| JP | 2003-228302 | 8/2003 |
| JP | 2003 243160 | 8/2003 |
| JP | 2003-297552 | 10/2003 |
| JP | 2003-332061 | 11/2003 |
| JP | 2004 29552 | 1/2004 |
| JP | 2004-070351 | 3/2004 |
| JP | 04-151656 | 5/2004 |
| JP | 2004 303733 | 10/2004 |
| JP | 2004-311385 | 11/2004 |
| JP | 2004 319103 | 11/2004 |
| JP | 2005-049808 | 2/2005 |
| JP | 2005-71984 | 3/2005 |
| JP | 2005-112676 | 4/2005 |
| JP | 2005-510831 | 4/2005 |
| JP | 2005-123089 | 5/2005 |
| JP | 2005-158672 | 6/2005 |
| JP | 2005 190683 | 7/2005 |
| JP | 2005-251415 | 9/2005 |
| JP | 2005-258405 | 9/2005 |
| JP | 2005 340020 | 12/2005 |
| JP | 2006-524419 | 10/2006 |
| KR | 10-1995-0009817 | 4/1995 |
| KR | 10-1998-0017583 | 6/1998 |
| KR | 10-2000-0045292 | 7/2000 |
| KR | 10-2001-0084380 | 9/2001 |
| KR | 10-2002-0051153 | 6/2002 |
| KR | 10-0442240 | 1/2003 |
| KR | 10-2003-0027169 | 4/2003 |
| KR | 10-2003-0044656 | 6/2003 |
| KR | 10-2004-0011138 | 2/2004 |
| KR | 10-2005-0061747 | 6/2005 |
| KR | 2005070543 A * | 7/2005 |
| KR | 10-2005-0112318 | 11/2005 |
| KR | 10-2005-0115408 | 12/2005 |
| KR | 10-2006-0005369 | 1/2006 |
| TW | 569166 | 1/2004 |
| TW | I227094 | 1/2005 |
| TW | I228686 | 3/2005 |
| TW | I237218 | 8/2005 |
| TW | 200541379 | 12/2005 |
| TW | 200541382 | 12/2005 |
| WO | WO 02/21557 | 3/2002 |
| WO | WO 03/005774 | 1/2003 |
| WO | WO 2004-095597 | 4/2004 |
| WO | WO 2004/094331 | 11/2004 |
| WO | WO 2004/112160 | 12/2004 |
| WO | WO 2005/050751 | 6/2005 |

OTHER PUBLICATIONS

Japan Office Action dated Jul. 28, 2009 of the Japanese Patent Application No. 2006-153567.
Japan Office Action dated Jul. 28, 2009 of the Japanese Patent Application No. 2006 178508.
Japan Office Action dated Jul. 14, 2009 of the Japanese Patent Application No. 2006-151960.
Japan Office Action dated Jul. 14, 2009 of the Japanese Patent Application No. 2006-165210.
U.S. Appl. No. 11/540,024, filed Sep. 29, 2006, Published as 2007/0170605 on Jul. 26, 2007 and its ongoing prosecution history, including without limitation Office Actions, Amendments, Remarks and any other potentially relevant documents.
U.S. Appl. No. 11/540,021, filed Sep. 29, 2006, Published as 2007/0170423 on Jul. 26, 2007, and its ongoing prosecution history, including without limitation Office Actions, Amendments, Remarks, and any other potentially relevant documents.
U.S. Appl. No. 11/541,047, filed Sep. 29, 2006, Published as 2007/0170839 on Jul. 26, 2007, and its ongoing prosecution history, including without limitation Office Actions, Amendments, Remarks, and any other potentially relevant documents.
U.S. Appl. No. 11/541,139, filed Sep. 29, 2006, Published as 2007/0170845 on Jul. 26, 2007, and its ongoing prosecution history, including without limitation Office Actions, Amendments, Remarks and any other potentially relevant documents.
U.S. Appl. No. 11/529,916, filed Sep. 29, 2006, Published as 2007/0170850 on Jul. 26, 2007, and its ongoing prosecution history, including without limitation Office Actions, Amendments, Remarks, and any other potentially relevant documents.
U.S. Appl. No. 11/529,916, filed Sep. 29, 2006, Published as 2007/0170855 on Jul. 26, 2007, and its ongoing prosecution history, including without limitation Office Actions, Amendments, Remarks, and any other potentially relevant documents.
U.S. Appl. No. 11/529,914, filed Sep. 29, 2006, Published as 2007/0170857 on Jul. 26, 2007, and its ongoing prosecution history, including without limitation Office Actions, Amendments, Remarks, and any other potentially relevant documents.
U.S. Appl. No. 11/540,103, filed Sep. 29, 2006, Published as 2007/0170859 on Jul. 26, 2007, and its ongoing prosecution history, including without limitation Office Actions, Amendments, Remarks and any other potentially relevant documents.
U.S. Appl. No. 11/540,151, filed Sep. 29, 2006, Published as 2007/0170860 on Jul. 26, 2007, and its ongoing prosecution history, including Office Actions, Amendments, Remarks, and any other potentially relevant documents.
U.S. Appl. No. 11/540,157, filed Sep. 29, 2006, Published as 2007/0170861 on Jul. 26, 2007, and its ongoing prosecution history, including without limitation Office Actions, Amendments, Remarks and any other potentially relevant documents.
U.S. Appl. No. 11/529,995, filed Sep. 29, 2006, Published as 2007/0171637 on Jul. 26, 2007, and its ongoing prosecution history, including without limitation Office Actions, Amendments, Remarks, and any other potentially relevant documents.
U.S. Appl. No. 11/541,055, filed Sep. 29, 2006, Published as 2007/0173167 on Jul. 26, 2007, and its ongoing prosecution history, including without limitation Office Actions, Amendments, Remarks, and any other potentially relevant documents.
U.S. Appl. No. 11/541,009, filed Sep. 29, 2006, Published as 2007/0176549 on Aug. 2, 2007, and its ongoing prosecution history, including without limitation Office Actions, Amendments, Remarks, and any other potentially relevant documents.
U.S. Appl. No. 11/541,048, filed Sep. 29, 2006, Published as 2007/0177069 on Aug. 2, 2007, and its ongoing prosecution history, including without limitation Office Actions, Amendments, Remarks, and any other potentially relevant documents.
U.S. Appl. No. 11/529,883, filed Sep. 29, 2006, Published as 2007/0197120 on Aug. 23, 2007, and its ongoing prosecution history, including without limitation Office Actions, Amendments, Remarks, and any other potentially relevant documents.

U.S. Appl. No. 11/540,008, filed Sep. 29, 2006, Published as 2007/0232182 on Oct. 4, 2007, and its ongoing prosecution history, including without limitation Office Actions, Amendments, Remarks, and any other potentially relevant documents.

U.S. Appl. No. 11/670,356, filed Feb. 1, 2007, Published as 2008/0074036 on Mar. 27, 2008, and its ongoing prosecution history, including without limitation Office Actions, Amendments, Remarks, and any other potentially relevant documents.

Chinese Office Action in Patent Application No. 200710000143.2 dated Sep. 26, 2008.

Chinese Office Action issued Oct. 10, 2008 in Patent Application No. 2007100040808.

Chinese Office Action issued Aug. 1, 2008 in Patent Application No. 200710001301.6.

Chinese Office Action issued Oct. 10, 2008 in Patent Application No. 200710003941.0.

Chinese Office Action issued Oct. 10, 2008 in Patent Application No. 200710001782.0.

Chinese Office Action issued on Aug. 1, 2008 in Patent Application No. 2007100015717.

Chinese Office Action Issued on Dec. 19, 2008 in Patent Application No. 2007100072531.

Chinese Rejection Decision issued on May 8, 2009 in Patent Application No. 200710004080.8.

Chinese Office Action issued on Jan. 8, 2010 in Patent Application No. 200710003941.0.

European Search Report from Patent Application No. 07101294.2 dated Jun. 6, 2007.

European Search Report from Patent Application No. 07101295.9 dated May 24, 2007.

Japanese Office Action dated Dec. 1, 2009 in Patent Application No. 2006-193033.

Japanese Office Action mailed Jun. 30, 2009 for Japanese Application No. 2006-222065.

Japanese Office Action dated Jul. 28, 2009 in Patent Application No. 2006-153567.

Japanese Office Action for Patent Application No. 2006-193032 mailed May 19, 2009.

Japanese Office Action issued on May 19, 2009 in Japanese Patent Application No. 2006-189628.

Japanese Office Action issued on Oct. 20, 2009 in Patent Application No. 2006-189628.

Japanese Office Action issued on Oct. 27, 2009 in Patent Application No. 2006-256002.

Japanese Office Action issued Sep. 8, 2009 in Patent Application 2007-011996.

Japanese Office Action in Patent Application No. 2006-193034 mailed May 19, 2009.

Korean Notice of Allowance issued Aug. 2, 2007 in Patent Application No. 10-2006-0016188.

Korean Notice of Allowance issued Jul. 3, 2007 in Patent Application No. 10-2006-0035455.

Korean Office Action from Patent Application No. 10-2006-0006148 dated Sep. 26, 2006.

Korean Office Action from Patent Application No. 10-2006-0007890, dated Sep. 26, 2006.

Korean Office Action from Patent Application No. 10-2006-0007963, dated Sep. 26, 2006.

Korean Office Action issued Feb. 12, 2007 in Patent Application No. 10-2006-0035455.

Taiwanese Office Action issued Jan. 18, 2010 in Application No. 95145107.

U.S. Office Action dated Feb. 2, 2009 in U.S. Appl. No. 11/529,916.

U.S. Office Action dated Apr. 3, 2009 in U.S. Appl. No. 11/529,891.

U.S. Office Action dated Apr. 3, 2009 in U.S. Appl. No. 11/541,055.

U.S. Office Action dated Mar. 29, 2010 in U.S. Appl. No. 11/541,055.

U.S. Office Action dated Aug. 19, 2009 in U.S. Appl. No. 11/529,914.

U.S. Office Action (Advisory Action) dated May 19, 2010 in U.S. Appl. No. 11/529,914.

U.S. Office Action dated Dec. 30, 2009 in U.S. Appl. No. 11/541,139.

U.S. Office Action dated Nov. 5, 2009 in U.S. Appl. No. 11/541,047.

U.S Office Action dated Nov. 28, 2007 in U.S. Appl. No. 11/540,150.

U.S. Office Action dated Aug. 21, 2008 in U.S. Appl. No. 11/540,150.

U.S. Office Action dated Nov. 15, 2007 in U.S. Appl. No. 11/541,009.

U.S. Office Action dated Jun. 19, 2008 in U.S. Appl. No. 11/541,009.

U.S. Office Action dated Dec. 3, 2008 in U.S. Appl. No. 11/541,009.

U.S. Office Action dated Apr. 30, 2009 in U.S. Appl. No. 11/540,151.

U.S. Office Action dated Feb. 11, 2009 in U.S. Appl. No. 11/529,883.

U.S. Office Action dated Jul. 17, 2009 in U.S. Appl. No. 11/529,883.

U.S. Office Action dated Dec. 30, 2009 in U.S. Appl. No. 11/541,048.

U.S. Office Action dated Dec. 8, 2008 in U.S. Appl. No. 11/540,021.

U.S. Office Action dated Apr. 27, 2009 in U.S. Appl. No. 11/540,021.

U.S. Office Action dated Feb. 19, 2009 in U.S. Appl. No. 11/540,024.

U.S. Office Action dated May 4, 2009 in U.S. Appl. No. 11/529,995.

Taiwanese Office Action dated Apr. 2, 2010 in Application No. 95144932.

* cited by examiner

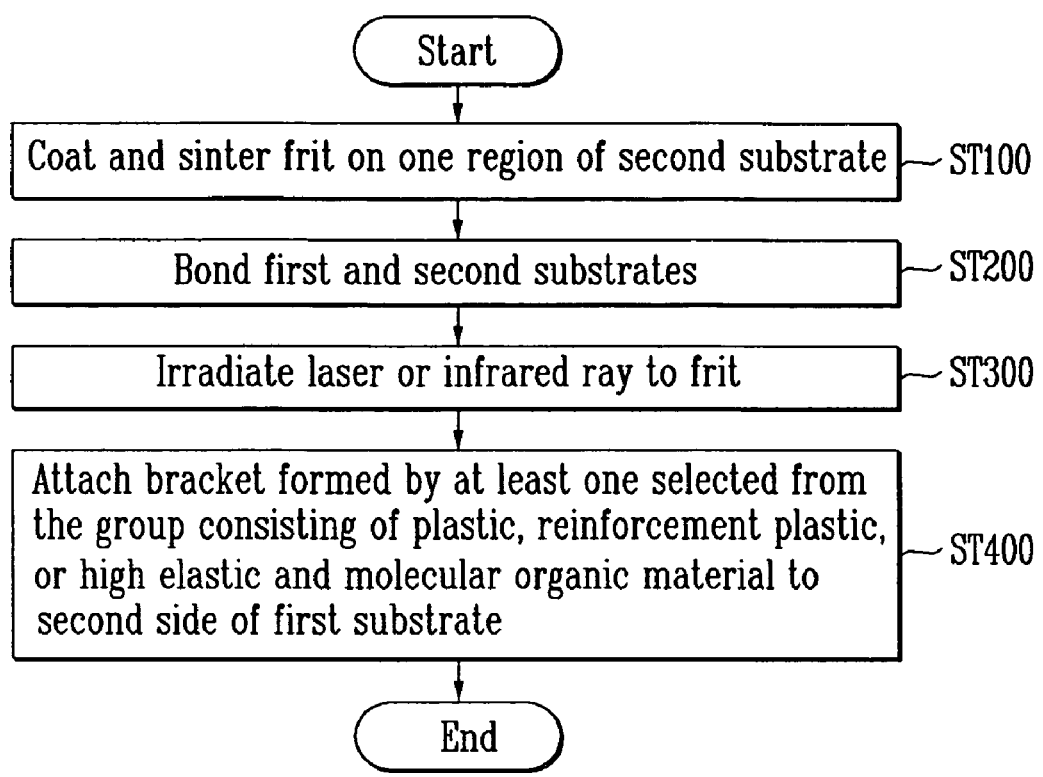

ORGANIC LIGHT EMITTING DISPLAY AND FABRICATING METHOD OF THE SAME

CROSS-REFERENCE TO RELATED APPLICATIONS

This application claims the benefit of Korean Patent Application No. 10-2006-0007889, filed on Jan. 25, 2006, in the Korean Intellectual Property Office, the disclosure of which is incorporated herein by reference.

This application is related to and incorporates herein by reference the entire contents of the following concurrently filed applications:

| Title | Filing Date | Application No. |
|---|---|---|
| ORGANIC LIGHT-EMITTING DISPLAY DEVICE AND METHOD OF FABRICATING THE SAME | | |
| ORGANIC LIGHT-EMITTING DISPLAY DEVICE AND METHOD OF MANUFACTURING THE SAME | | |
| ORGANIC LIGHT EMITTING DISPLAY DEVICE | | |
| ORGANIC LIGHT-EMITTING DISPLAY DEVICE WITH FRIT SEAL AND REINFORCING STRUCTURE | | |
| ORGANIC LIGHT EMITTING DISPLAY DEVICE METHOD OF FABRICATING THE SAME | | |
| ORGANIC LIGHT EMITTING DISPLAY AND METHOD OF FABRICATING THE SAME | | |
| ORGANIC LIGHT-EMITTING DISPLAY DEVICE WITH FRIT SEAL AND REINFORCING STRUCTURE BONDED TO FRAME | | |
| METHOD FOR PACKAGING ORGANIC LIGHT EMITTING DISPLAY WITH FRIT SEAL AND REINFORCING STURUTURE | | |
| METHOD FOR PACKAGING ORGANIC LIGHT EMITTING DISPLAY WITH FRIT SEAL AND REINFORCING STURUTURE | | |
| ORGANIC LIGHT-EMITTING DISPLAY DEVICE AND THE PREPARATION METHOD OF THE SAME | | |
| ORGANIC LIGHT EMITTING DISPLAY AND FABRICATING METHOD OF THE SAME | | |
| ORGANIC LIGHT-EMITTING DISPLAY AND METHOD OF MAKING THE SAME | | |
| ORGANIC LIGHT EMITTING DISPLAY AND FABRICATING METHOD OF THE SAME | | |
| ORGANIC LIGHT EMITTING DISPLAY DEVICE AND MANUFACTURING METHOD THEREOF | | |
| ORGANIC LIGHT-EMITTTNG DISPLAY DEVICE AND MANUFACTURING METHOD OF THE SAME | | |
| ORGANIC LIGHT EMITTING DISPLAY AND METHOD OF FABRICATING THE SAME | | |
| ORGANIC LIGHT EMITTING DISPLAY DEVICE METHOD OF FABRICATING THE SAME | | |
| ORGANIC LIGHT EMITTING DISPLAY AND METHOD OF FABRICATING THE SAME | | |

BACKGROUND OF THE INVENTION

1. Field of the Invention

The present invention relates to an organic light emitting display, and more particularly to packaging of an organic light emitting display.

2. Description of the Related Technology

In recent years, organic light emitting display using organic light emitting diode has been watched. The organic light emitting display is an emissive display, which electrically excites organic compound having fluorescent characteristic to emit light. The organic light emitting display can be driven with a low voltage, has excellent light-emission, a wide viewing angle, and a high-speed response.

The organic light emitting display includes a plurality of pixels formed on a substrate. Each of the pixels includes an organic light emitting diode and a thin film transistor (TFT) for driving the organic light emitting diode. Since such an organic light emitting diode is susceptible to oxygen and moisture, a sealing structure has been proposed to prevent the oxygen and moisture from entering by covering a deposition substrate with a metal cap having absorbent or a sealing glass substrate.

SUMMARY OF CERTAIN INVENTIVE ASPECTS

One aspect of the invention provides an organic light-emitting display device. The device comprises: an organic light-emitting display unit comprising a front substrate, a rear substrate, an array of organic light-emitting pixels and a frit seal, wherein the array is interposed between the front and rear substrates, wherein the frit seal is interposed between the front and rear substrates while surrounding the array; and a bracket configured to receive at least part of the organic light emitting display unit, the bracket comprising a polymeric material, wherein the display unit is secured to the bracket.

The bracket may be made of the polymeric material in its entirety. The bracket may be secured to the bracket by an adhesive layer. The adhesive may comprise one or more selected from the group consisting of epoxy, acrylate, urethane acrylate and acrylate cyanide materials. The bracket may comprise a rear wall opposing the rear substrate, wherein the rear substrate is bonded to the rear-wall of the bracket.

The rear substrate may comprise side surfaces, wherein the bracket comprises side walls, wherein a first one of the side surfaces opposes a first one of the side walls, and wherein the first side surface is bonded to the first side wall. The rear substrate may comprise side surfaces, wherein the bracket comprises side walls, wherein each of the side surfaces opposes one of the side walls, and wherein each side surface is bonded to the respective side wall. The side walls may surround the rear substrate. The bracket may comprise a rear wall opposing the rear substrate, wherein the rear substrate is bonded to the rear wall of the bracket.

The front substrate may comprise side surfaces, wherein the bracket comprises side walls, wherein a first one of the side surfaces opposes a first one of the side walls, and wherein the first side surface is bonded to the first side wall. The front substrate may comprise side surfaces, wherein the bracket comprises side walls, wherein each of the side surfaces opposes one of the side walls, and wherein each side surface is bonded to the respective side wall. The side walls may surround the front substrate, the frit seal and the rear substrate. The bracket may comprise a rear wall opposing the rear substrate, wherein the rear substrate is bonded to the rear wall of the bracket. The side walls may extend from edges of the rear wall.

Another aspect of the invention provides a method of making an organic light emitting display device. The method comprises: providing an organic light-emitting display unit comprising a front substrate, a rear substrate, an array of organic light-emitting pixels and a frit seal, wherein the array is interposed between the front and rear substrates, wherein the frit seal is interposed between the front and rear substrates while surrounding the array; providing a bracket configured to receive at least part of the organic light emitting display unit, the bracket comprising a polymeric material; and adhering the display unit to the bracket.

In the method, adhering may comprise: applying an adhesive layer on a surface of the display unit; contacting a wall of the bracket to the surface; and curing the adhesive layer, thereby bonding the wall of the bracket and the display unit. The adhesive may comprise one or more selected from the group consisting of epoxy, acrylate, urethane acrylate and acrylate cyanide materials. The bracket may be made of the polymeric material in its entirety. The bracket may comprise a rear wall opposing the rear substrate, wherein the rear substrate is bonded to the rear wall of the bracket.

The rear substrate may comprise side surfaces, wherein the bracket comprises side walls, wherein each of the side surfaces opposes one of the side walls, and wherein each side surface is bonded to the respective side wall. The side walls may surround the rear substrate, the frit seal and the rear substrate. The side walls may surround the front substrate, the frit seal and the rear substrate. The bracket may comprise a rear wall opposing the rear substrate, and wherein the side walls extend from edges of the rear wall.

Another aspect of the invention provides an organic light emitting display and a fabricating method of the same, which form a bracket by at least one material selected from the group consisting of a plastic, a reinforcement plastic, or a high elastic and high molecular organic material in order to enhance an adhesive strength and an elasticity of a substrate and a bracket adhered to each other by means of an adhesive.

Another aspect of the invention provides an organic light emitting display which comprises: a first substrate including a pixel region and a non-pixel region, at least one organic light emitting diode being formed at the pixel region and having a first electrode, an organic layer, and a second electrode, and the non-pixel region being formed beside the pixel region, and a second substrate bonded to a first side of the first substrate to seal the pixel region; a flit disposed between the non-pixel region of the first substrate and the second substrate for adhering the first and second substrates to each other; a bracket formed by at least one material selected from the group consisting of a plastic, a reinforcement plastic, or a high elastic and high molecular organic material; and an adhesive formed by at least one resin selected from the group consisting of epoxy, acrylate, urethane acrylate, and acrylate cyanide, and for adhering the bracket to the first substrate.

Yet another aspect of the invention provides a method for fabricating an organic light emitting display including a first substrate and the second substrate, the first substrate including a pixel region and a non-pixel region, at least one organic light emitting diode being formed at the pixel region, the non-pixel region being formed beside the pixel region, and the second substrate being bonded to one region having the pixel region of the first substrate, the method comprising the steps of: coating and annealing a frit on one region of the second substrate; sealing the first substrate and the second substrate to each other; melting the frit to adhere the first and second substrates to each other; providing a bracket formed by at least one material selected from the group consisting of a plastic, a reinforcement plastic, or a high elastic and high molecular organic material; receiving at least the first substrate in the bracket; and adhering the bracket to the first substrate using an adhesive, the adhesive being at least one resin selected from the group consisting of epoxy, acrylate, urethane acrylate, and acrylate cyanide.

BRIEF DESCRIPTION OF THE DRAWINGS

These and/or other aspects and advantages of the invention will become apparent and more readily appreciated from the following description of embodiments, taken in conjunction with the accompanying drawings of which:

FIG. 4 is a flow chart that illustrates a method for fabrication an organic light emitting display according to an embodiment.

DETAILED DESCRIPTION OF CERTAIN INVENTIVE EMBODIMENTS

Figure 1:
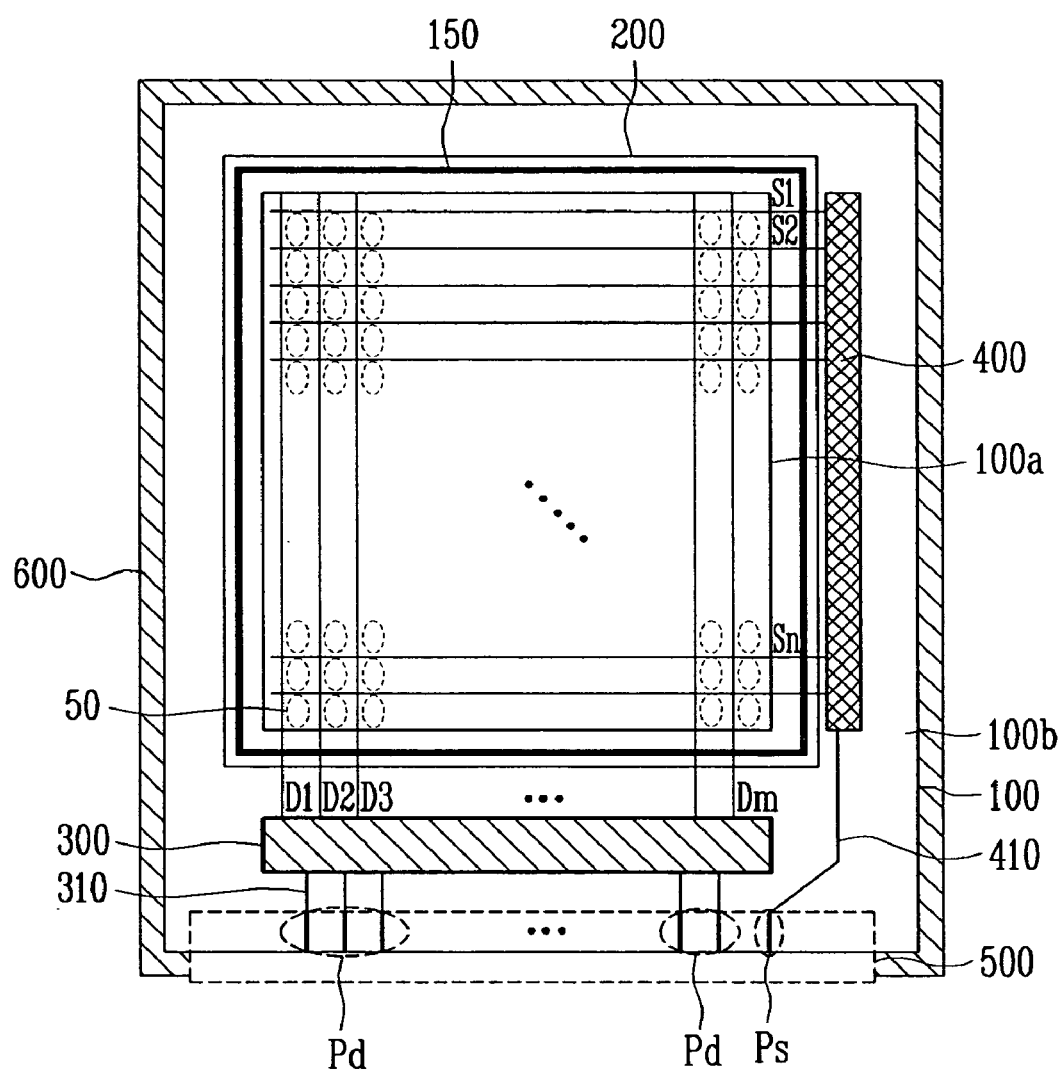
FIG. 1 is a plan view showing an example of an organic light emitting display according to an embodiment.

Hereinafter, embodiments according to the invention will be described with reference to the accompanying drawings. Here, when one element is connected to another element, one element may be not only directly connected to another element but also indirectly connected to another element via another element. Further, irrelevant elements are omitted for clarity. Also, like reference numerals refer to like elements throughout.

An organic light emitting display (OLED) is a display device comprising an array of organic light emitting diodes. Organic light emitting diodes are solid state devices which include an organic material and are adapted to generate and emit light when appropriate electrical potentials are applied.

Figure 5A:
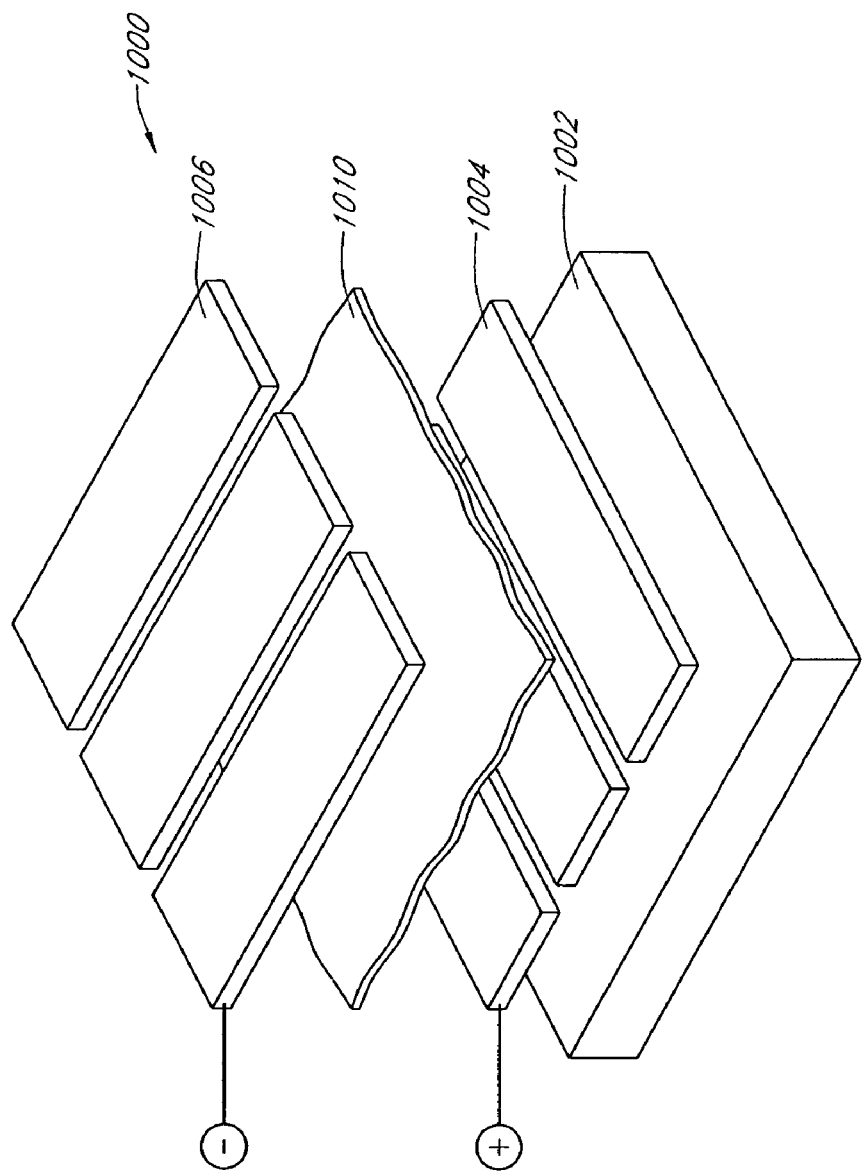
FIG. 5A is a schematic exploded view of a passive matrix type organic light emitting display device in accordance with one embodiment.
Figure 5B:
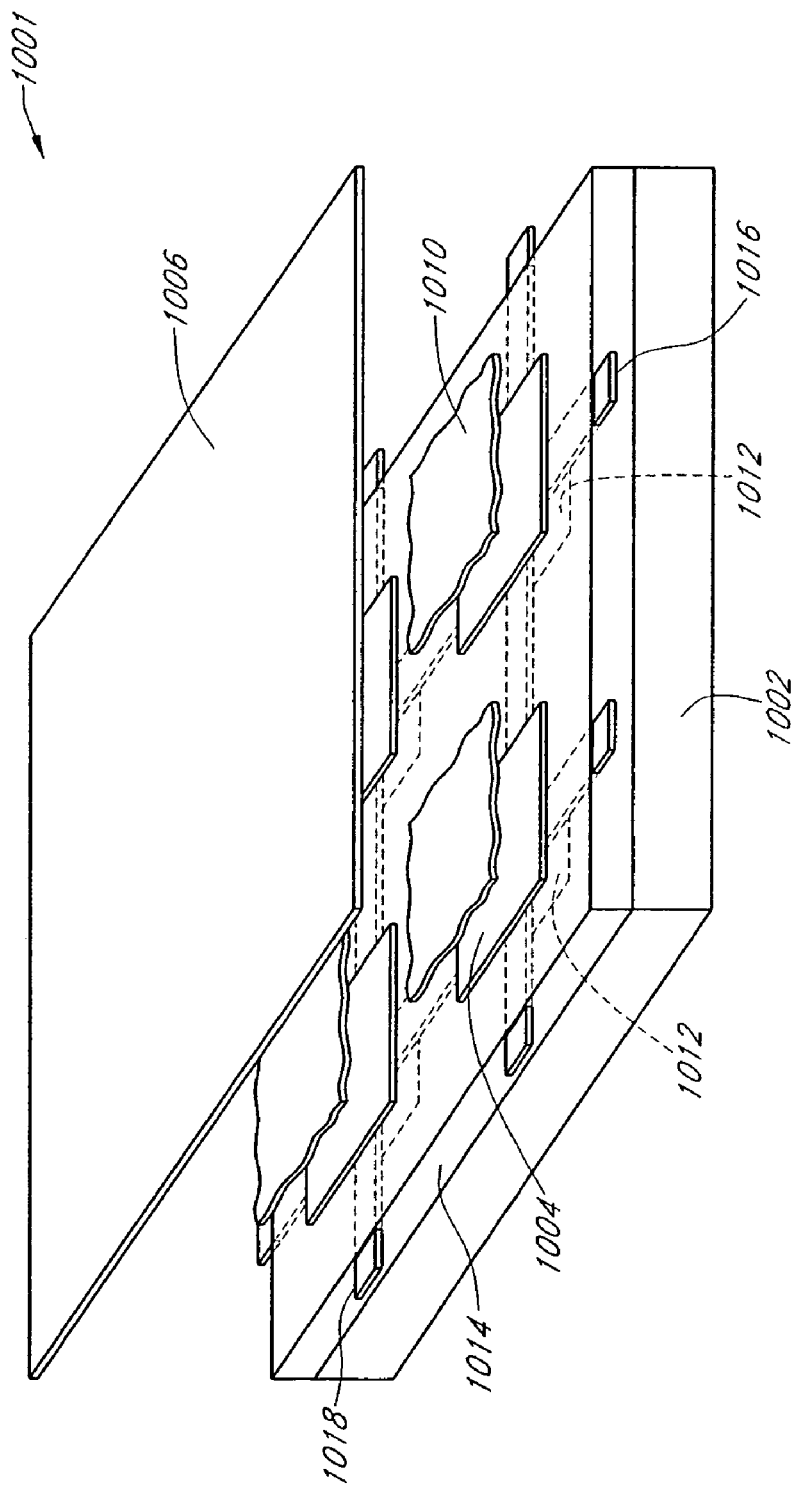
FIG. 5B is a schematic exploded view of an active matrix type organic light emitting display device in accordance with one embodiment.

OLEDs can be generally grouped into two basic types dependent on the arrangement with which the stimulating electrical current is provided. FIG. 5A schematically illustrates an exploded view of a simplified structure of a passive matrix type OLED 1000. FIG. 5B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 5A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 5B, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each local driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 5D:
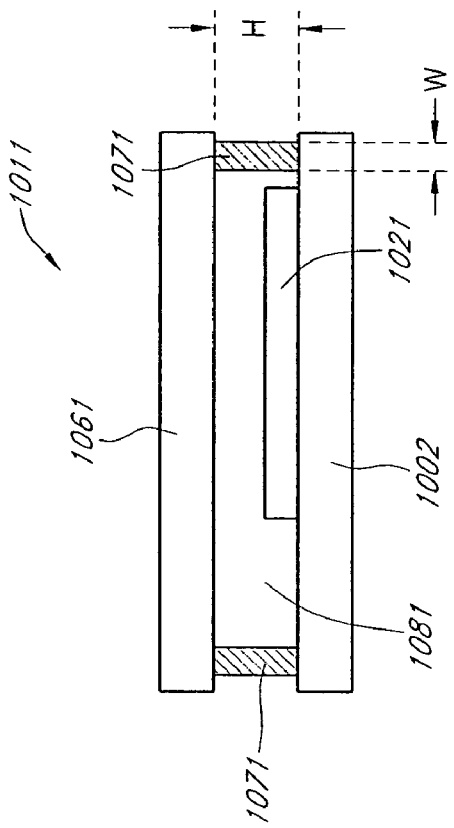
FIG. 5D is a cross-sectional view of the organic light emitting display of FIG. 5C, taken along the line d-d.
Figure 5C:
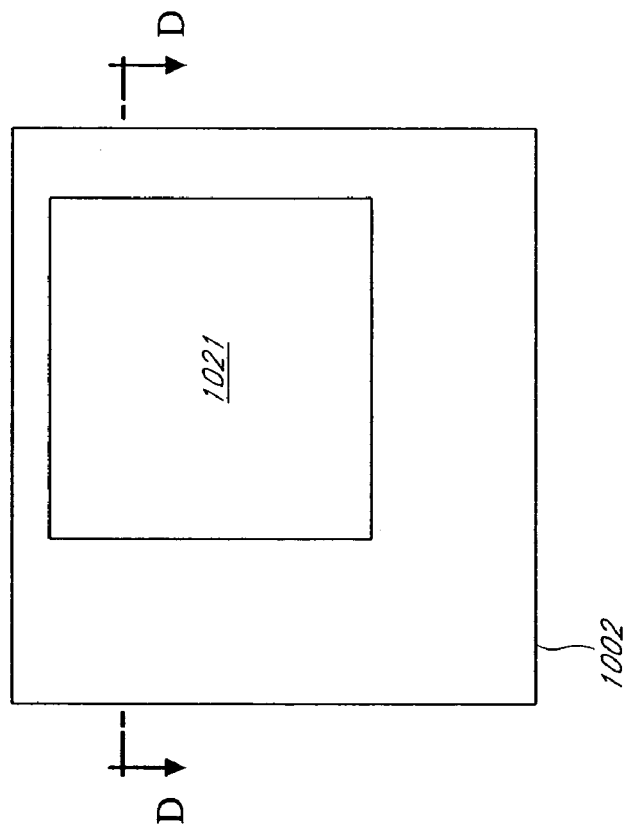
FIG. 5C is a schematic top plan view of an organic light emitting display in accordance with one embodiment.

In many embodiments, an OLED pixel array 1021 comprising a plurality of organic light emitting pixels is arranged over a substrate 1002 as shown in FIG. 5C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 5D schematically illustrates a cross-section of an encapsulated OLED device 1011 having a layout of FIG. 5C and taken along the line d-d of FIG. 5C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m²-day and to water of less than $10^{-6}$ g/m²-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 5D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 5D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the flit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the flit material to form the seal 1071.

Figure 5E:
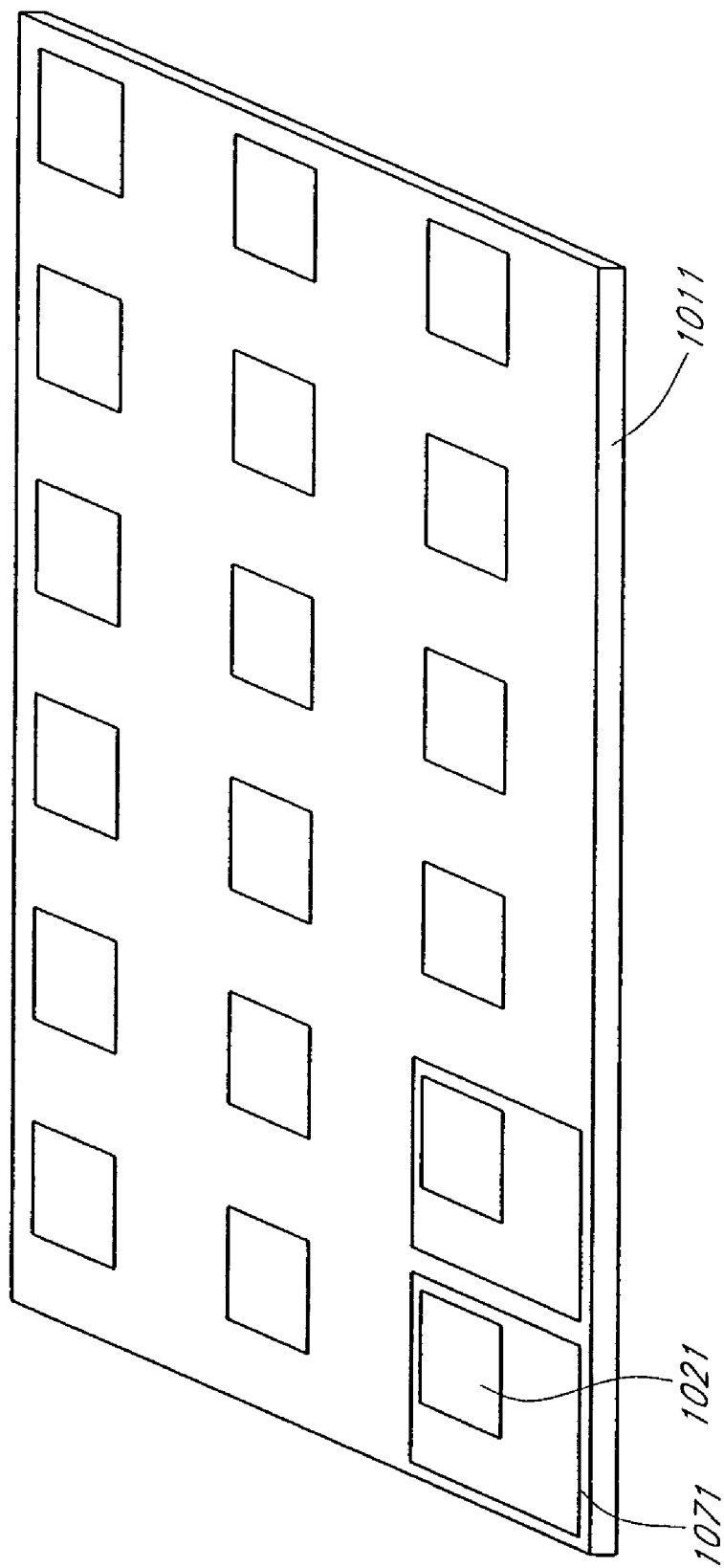
FIG. 5E is a schematic perspective view illustrating mass production of organic light emitting devices in accordance with one embodiment.

In some embodiments, OLED devices 1011 are mass produced. In an embodiment illustrated in FIG. 5E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 5D. In certain embodiments, the individual OLED devices 1011 then further undergo additional packaging operations to further improve the sealing formed by the frit seal 1071 and the top and bottom substrates 1061, 1002.

A structure including a bracket to protect a substrate and a sealing substrate from an external impact has been suggested. In the structure, a thermal treatment is performed during a process of adhering a bracket to a substrate. Owing to a thermal expansion coefficient difference between the bracket and the substrate, a fine crack occurs on a region of the substrate. Furthermore, the bracket is made of a metal that does not have elasticity. Accordingly, when a physical force such as a vibration or impact is applied to the bracket, it directly transfers the physical force to a device to be broken. Moreover, the bracket of a metal material has a different material property from that of a high molecular organic material such as epoxy used as an adhesive, an adhesive strength of the bracket with the substrate is poor.

Figure 2:
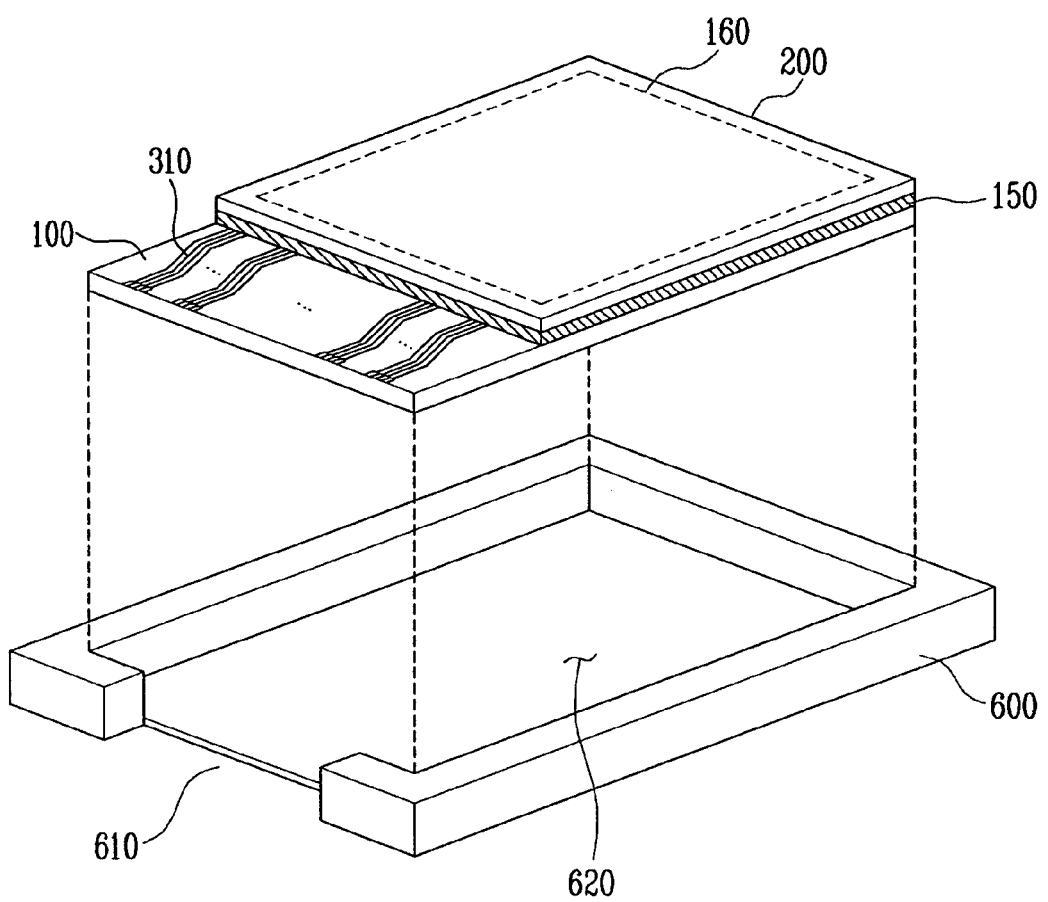
FIG. 2 is a cross-sectional view of the organic light emitting display shown in FIG. 1.

FIG. 1 is a plan view showing an example of an organic light emitting display according to an embodiment. FIG. 2 is a cross-sectional view of the organic light emitting display shown in FIG. 1.

With reference to FIG. 1 and FIG. 2, the organic light emitting display according to an embodiment includes a first substrate 100, a frit 150, a second substrate 200, and a bracket 600.

The first substrate 100 includes a pixel region 100a and a non-pixel region 100b. The pixel region 100a includes a plurality of scan lines S1, S2, S3, . . . , Sn, a plurality of data lines D1, D2, D3, . . . , Dm, and a plurality of pixels 50. The plurality of pixels 50 are arranged on an region defined by the scan lines S1, S2, S3, . . . , Sn and the data lines D1, D2, D3, . . . , Dm. Each of the pixels 50 are coupled with the scan lines S1, S2, S3, . . . , Sn, the data lines D1, D2, D3, . . . , Dm, and a power supply line (not shown). Each pixel 50 expresses one of red, green, blue, and white colors with a predetermined luminance level. Consequently, the pixel region 100a expresses a predetermined image according to a color and a luminance of each pixel 50. The non-pixel region 100b is formed at a peripheral region of the pixel region 100a. The non-pixel region 100b indicates all the regions except the pixel region 100a on the first substrate 100. On the other hand, the non-pixel region 100b includes a data driver 300, a scan driver 400, and a pad portion 500.

The data driver 300 supplies a data signal to the plurality of data lines D1, D2, D3 extending in the pixel region 100a of the first substrate 100. The data driver 300 is formed at one side of the pixel region 100a in the first substrate 100 and at another side adjacent to one side of the pixel region on which the scan driver 400 is formed. Here, the data driver 300 is mounted on the first substrate 100 in a chip-on-glass (COG) type chip pattern. Further, the data driver 300 is coupled with a plurality of first pads Pd in the pad portion 500 through a plurality of data supply lines 310.

The scan driver 400 sequentially supplies a scan signal to the plurality of scan lines S1, S2, S3, . . . , Sn extending in the pixel region 100a. The scan driver 400 is formed at one side of the pixel region 100a in the first substrate 100. The scan driver 400 is coupled with at least one first pad Ps in the pad portion 500 through at least one scan supply line 410.

The pad portion 500 is formed on the first substrate 100 adjacent to the first scan driver 400 and the data driver 500. The pad portion 500 is electrically coupled to the scan supply line 410 and the data supply line 310, and supplies an electric signal to the plurality of scan lines S1, S2, S3, . . . , Sn and the plurality of data lines D1, D2, D3, . . . , Dm of the pixel region 100a.

The frit 150 is disposed between a non-pixel region 100b of the first substrate 100 and the second substrate 200, and adheres the first substrate 100 and the second substrate 200 to each other. As shown in the drawings, the pixel region 100a formed on the first substrate 100 may be sealed with the frit. When the scan driver 400 is a built-in type, the pixel region 100a and the scan driver 400 are sealed with the frit. Since the frit 150 provides a seal between the first substrate 100 and the second substrate 200, an organic light emitting diode interposed between the first substrate 100 and the second substrate 200 can be protected from water or oxygen. The frit 150 may also include a filler (not shown) and an absorbent (not shown). The filler adjusts a coefficient of thermal expansion. The absorbent absorbs a laser or an infrared ray. Further, the frit 150 may be cured by a laser or ultra-violet ray irradiation. Here, an intensity of the laser irradiated to the flit may range about 20 through about 60 W.

When a temperature of a glass material is suddenly reduced, the frit 150 in a glass power is produced. In one embodiment, a glass powder including an oxide powder is used. Further, when organic materials are added to the frit 150, a paste in a gel state is formed. When the frit is sintered at a predetermined temperature, organic materials are removed, the paste in the gel state is cured and a frit 150 in a solid state remains. In one embodiment, a temperature of annealing the frit 150 ranges from about 300° C. to about 700° C.

The second substrate 200 is bonded to one region of the first substrate 100 having the pixel region 100a. Here, the second substrate 200 serves to protect an organic light emitting diode (not shown) formed at the pixel region 100a of the first substrate 100 from an external water or oxygen. Here, the second substrate 200 may be formed of at least one selected from the group consisting of a silicon oxide $SiO_2$, a silicon nitride SiNx, and a silicon oxy-nitride SiOxNy. However, the invention is not limited thereto.

Hereinafter, the first substrate 100 and the second substrate bonded by a sealant 150 may be referred to as "bonded substrates". In addition, a side of the first substrate 100 facing the second substrate may be referred to as "a first side", and the other side of the first substrate 100 may be referred to as "second side".

In one embodiment, a bracket 600 is attached to the second side of the first substrate 100. Here, the bracket 600 may be formed to cover an entire surface of the second side of the first substrate 100. Further, the bracket 600 fixes the bonded substrates 100 and 200 to protect the bonded substrates 100 and 200 from external impact. The bracket 600 includes a groove 600 to receive at least the first substrate 100. In one embodiment, the bracket 600 may be formed by at least one selected from the group consisting of a plastic, a reinforcement plastic, and a high elastic and high molecular organic material, which has an excellent elasticity and an excellent adhesive strength with organic materials. Moreover, an opening portion 610 may be formed on one side of the bracket 600 for a wiring extending from the pad portion 140 to an FPC (not shown).

An adhesive (not shown) may be used to adhere the first substrate 100 to the bracket 600. The adhesive may include at least one resin selected from the group consisting of epoxy, acrylate, urethane acrylate, and acrylate cyanide resin. After the second side of the first substrate 100 or a peripheral portion of the bracket 600 has been applied with the adhesive, the adhesive is cured using a heat irradiation device (not shown) such as a laser, thereby bonding the bracket 600 to the bonded substrates 100 and 200. Because the bracket 600 is formed by at least one selected from the group consisting of a plastic, a reinforcement plastic, or a high elastic and high molecular organic material, it is similar to the adhesive in property. Accordingly, adhesive strength between the bracket 600 and the bonded substrates 100 and 200 by the adhesive is excellent.

Figure 3:
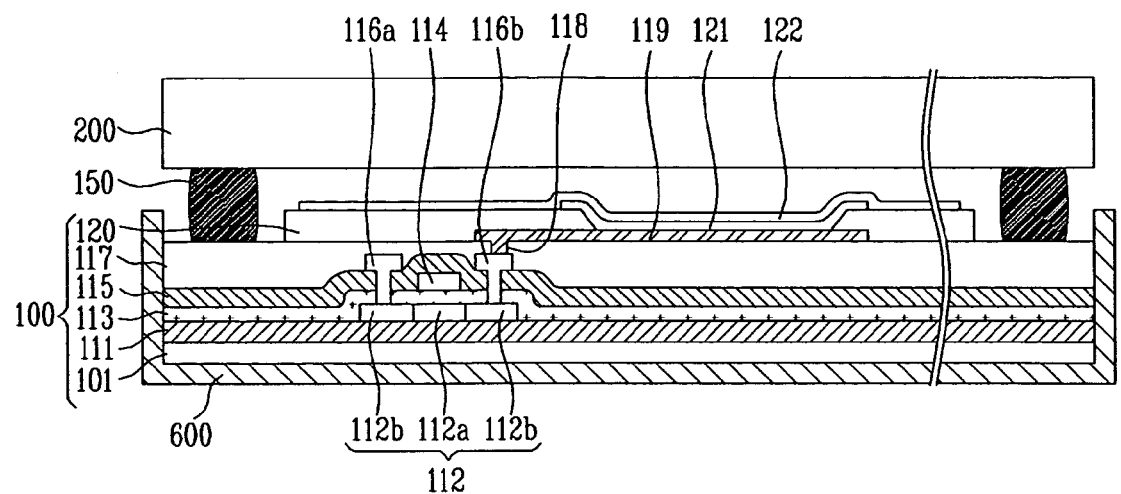
FIG. 3 is a perspective exploded view of the organic light emitting display shown in FIG. 1.

FIG. 3 is a perspective exploded view of the organic light emitting display shown in FIG. 1. Referring to FIG. 3, the organic light emitting display includes a first substrate 100, a frit 150, a second substrate 200, and a bracket 600.

The first substrate 100 includes a deposition substrate 101 and at least one organic light emitting diode 110. The at least one organic light emitting diode 110 is formed on the deposition substrate 101. First, a buffer layer 111 is formed on the deposition layer 101. The deposition substrate 101 may be formed of a glass. The buffer layer 111 is formed of an insulating material such as a silicon oxide $SiO_2$, or a silicon nitride SiNx. The buffer layer 111 prevents the deposition substrate 101 from being damaged due to external heat and the like.

A semiconductor layer 112 is formed on at least one region of the buffer layer 111. The semiconductor layer 112 includes an active layer 112a and a source/drain region 112b. A gate insulation layer 113 is formed on the buffer layer 111 to have the semiconductor layer 112. A gate electrode 114 is formed on one region of the gate insulation layer 113. The gate electrode 114 has a size corresponding to a width of the active layer 112a.

An interlayer insulation 115 is formed on the gate insulation layer 113 to have the gate electrode 114. Source and drain electrodes 116a and 116b are formed on a predetermined region of the interlayer insulation 115. The source and drain electrodes 116a and 116b are coupled to one exposed region of the source/drain region 112b. A planarization layer 117 is formed on the interlayer insulation 115 to have the source and drain electrodes 116a and 116b.

A first electrode 119 is formed on one region of the planarization layer 117. Here, the first electrode 119 is coupled with any one exposed region of the source and drain electrodes 116a and 116b through a via hole 118.

A pixel definition film 120 is formed on the planarization layer 117 to have the first electrode 119. The pixel definition film 120 includes an opening portion (not shown) and exposes at least one region of the first electrode 119.

An organic layer 121 is formed on the opening portion of the pixel definition film 120. A second electrode layer 122 is formed on the pixel definition film 120 to have the organic layer 121.

The frit 150 is disposed between the non-pixel region (not shown) of the first substrate 100 and the second substrate 200, and bonds the first substrate 100 and the second substrate 200 to each other. In one embodiment, the frit 150 may be used to seal pixel regions 100a formed on the first substrate 100. When a scan driver (not shown) is a built-in type, the frit 150 may seal the pixel region and the scan driver.

In order to protect the aforementioned structures formed on the first substrate 100 from external oxygen and moisture, the second substrate 200 is bonded to the first substrate 100 with the aforementioned structures with the frit 150. The second substrate 200 may include at least one material selected from the group consisting of silicon oxide $SiO_2$, silicon nitride SiNx, and silicon oxynitride SiOxNy, but the invention is not limited thereto.

The bracket 600 includes a groove 620 to receive the first substrate 100. The bracket 600 may include at least one selected from the group consisting of a plastic, a reinforcement plastic, or a high elastic and high molecular organic material, which has an excellent elasticity and an excellent adhesive strength with organic materials. Since a detailed description of the flit 150 and the bracket 160 was given with reference to FIG. 1 and FIG. 2, it is omitted.

FIG. 4 is a flow chart that illustrates a method for fabrication an organic light emitting display according to an embodiment. With reference to FIG. 4, a method for fabrication an organic light emitting display includes a first step ST100, a second step ST200, a third step ST300, and a fourth step ST400.

In a method for fabricating an organic light emitting display including a first substrate and the second substrate, the first step S100 is a step of coating and annealing a frit on one region of the second substrate. The first substrate includes a pixel region and a non-pixel region. At least one organic light emitting diode is formed in the pixel region. The non-pixel region is formed outside the pixel region. The second substrate is bonded to one region having the pixel region of the first substrate. In step S100, the frit is interposed between the second substrate and the non-pixel region. In one embodiment, the frit seals the pixel region formed on the first substrate. When a scan drive is a built-in type, the frit may seal the pixel region and the scan driver. Here, the flit may include a filler and an absorbent. The filler adjusts a coefficient of thermal expansion. The absorbent absorbs a laser or an infrared ray. When a temperature of a glass material is suddenly reduced, the frit in a glass power is produced. In one embodiment, a glass powder including an oxide powder is used. Further, when organic materials are added to the frit, a paste in a gel state is formed. The paste in the gel state is coated along a sealing line of the second substrate. Thereafter, when the frit is sintered at a predetermined temperature, organic materials are removed, the paste in the gel state is cured and a frit in a solid state remains. The temperature of annealing the frit 150 may range from about 300° C. to about 700° C.

The second step ST200 is a step of sealing the first substrate and the second substrate to each other. At this time, the first substrate and the second substrate are bonded to each other so that at least the organic light emitting diode formed on the first substrate is sealed.

The third step ST300 is a step of irradiating a laser or infrared ray to the frit. The laser or infrared ray irradiation melts the frit. The intensity of the laser for melting the frit may range from about 25 W to about 60 W. Owing to the melting of the frit, the first and second substrates are bonded to each other.

The fourth step ST400 is a step of attaching a bracket formed by at least one selected from the group consisting of a plastic, a reinforcement plastic, or a high elastic and high molecular organic material to the second side of the first substrate. A pixel region, a scan driver, a data driver, and a pad portion are all formed on the first side of the first substrate. After sealing the first and second substrates to each other, the bracket is provided to a second side of the first substrate. In one embodiment, the bracket is formed to cover an entire surface of the second side of the first substrate. That is, the bracket includes a groove to receive at least the first substrate, and the bonded substrates are fixed in the groove of the bracket. An adhesive adheres the bonded substrates and the bracket. The adhesive is at least one resin selected from the group consisting of epoxy, acrylate, urethane acrylate, and acrylate cyanide resin. Because the bracket is formed by at least one selected from the group consisting of a plastic, a reinforcement plastic, or a high elastic and high molecular organic material, it is similar to the adhesive in property. Accordingly, adhesive strength of the bracket with the bonded substrates is excellent. Moreover, an opening portion is formed at one side of the bracket to allow a wiring extending from the pad portion to be connected to an FPC. On the other hand, after the second side of the first substrate or a peripheral portion of the bracket is coated with the adhesive, the adhesive is cured using a heat irradiation device such as a laser, thereby attaching the bracket to the bonded substrates.

According to the organic light emitting display and a method for fabricating the same, because a bracket similar to the adhesive in property is used, an adhesive property of the bracket with bonded substrates is excellent. Furthermore, since the bracket is formed by a plastic material having a strong elasticity, impact resistance and durability are enhanced. Accordingly, a physical force resistance of a device is increased. This causes a product to be easily handled after the formation of the bracket. The bracket of the present invention is easier than a conventional metal bracket in processing such as annealing and transformation.

Although a few embodiments have been shown and described, it would be appreciated by those skilled in the art that changes might be made in this embodiment without departing from the principles and spirit of the invention, the scope of which is defined in the claims and their equivalents.

What is claimed is:

1. An organic light-emitting display device, comprising:
an organic light-emitting display unit comprising a front substrate, a rear substrate, an array of organic light-emitting pixels and a frit seal, wherein the array is interposed between the front and rear substrates, wherein the frit seal is interposed between the front and rear substrates while surrounding the array; and
a bracket configured to receive at least part of the organic light emitting display unit, the bracket comprising a polymeric material, wherein the display unit is secured to the bracket.

2. The device of claim 1, wherein the bracket is made of the polymeric material in its entirety.

3. The device of claim 1, wherein the bracket is secured to the substrates by an adhesive layer.

4. The device of claim 3, wherein the adhesive comprises one or more selected from the group consisting of epoxy, acrylate, urethane acrylate and acrylate cyanide materials.

5. The device of claim 1, wherein the bracket comprises a rear wall opposing the rear substrate, wherein the rear substrate is bonded to the rear wall of the bracket.

6. The device of claim 1, wherein the rear substrate comprises side surfaces, wherein the bracket comprises side walls, wherein a first one of the side surfaces opposes a first one of the side walls, and wherein the first side surface is bonded to the first side wall.

7. The device of claim 1, wherein the rear substrate comprises side surfaces, wherein the bracket comprises side walls, wherein each of the side surfaces opposes one of the side walls, and wherein each side surface is bonded to the respective side wall.

8. The device of claim 7, wherein the side walls surround the rear substrate.

9. The device of claim 7, wherein the bracket comprises a rear wall opposing the rear substrate, wherein the rear substrate is bonded to the rear wall of the bracket.

10. The device of claim 1, wherein the front substrate comprises side surfaces, wherein the bracket comprises side walls, wherein a first one of the side surfaces opposes a first one of the side walls, and wherein the first side surface is bonded to the first side wall.

11. The device of claim 1, wherein the front substrate comprises side surfaces, wherein the bracket comprises side walls, wherein each of the side surfaces opposes one of the side walls, and wherein each side surface is bonded to the respective side wall.

12. The device of claim 11, wherein the side walls surround the front substrate, the frit seal and the rear substrate.

13. The device of claim 11, wherein the bracket comprises a rear wall opposing the rear substrate, wherein the rear substrate is bonded to the rear wall of the bracket.

14. The device of claim 13, wherein the side walls extend from edges of the rear wall.

15. The device of claim 1, wherein the frit seal comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

* * * * *